(12) United States Patent
Kakinuma (10) Patent No.: US 11,894,248 B2
(45) Date of Patent: Feb. 6, 2024

(54) PROTECTIVE MEMBER ATTACHING APPARATUS AND PROTECTIVE MEMBER ATTACHING METHOD

(71) Applicant: DISCO CORPORATION, Tokyo (JP)

(72) Inventor: Yoshinori Kakinuma, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 47 days.

(21) Appl. No.: 17/648,830

(22) Filed: Jan. 25, 2022

(65) Prior Publication Data

US 2022/0254663 A1 Aug. 11, 2022

(30) Foreign Application Priority Data

Feb. 9, 2021 (JP) .................................. 2021-018942

(51) Int. Cl.
| | |
|---|---|
| *B32B 41/00* | (2006.01) |
| *H01L 21/67* | (2006.01) |
| *B29C 63/00* | (2006.01) |
| *B29C 63/02* | (2006.01) |
| *B29L 31/34* | (2006.01) |
| *B29K 101/12* | (2006.01) |

(52) U.S. Cl.
CPC .... *H01L 21/67132* (2013.01); *B29C 63/0004* (2013.01); *B29C 63/0065* (2013.01); *B29C 63/02* (2013.01); *B29K 2101/12* (2013.01); *B29L 2031/34* (2013.01)

(58) Field of Classification Search
CPC ......... H01L 21/67132; H01L 21/67109; H01L 21/6836; H01L 21/6838; H01L 21/78; H01L 2221/68327; B29C 63/0004; B29C 63/0065; B29C 63/02; B29K 2101/12; B29L 2031/34
USPC .................... 156/60, 64, 350, 351, 378, 379
See application file for complete search history.

(56) References Cited

U.S. PATENT DOCUMENTS

2018/0158796 A1* 6/2018 Otsuka .................... H01L 21/68

FOREIGN PATENT DOCUMENTS

| JP | 2017174977 A | * | 9/2017 |
|----|--------------|---|--------|
| JP | 2019201016 A | | 11/2019 |

* cited by examiner

*Primary Examiner* — Michael N Orlando
*Assistant Examiner* — Joshel Rivera
(74) *Attorney, Agent, or Firm* — GREER BURNS & CRAIN, LTD.

(57) ABSTRACT

A protective member attaching apparatus includes a pressure reduction chamber having an upper housing and a lower housing, a support table that is provided inside the lower housing and on which a substrate is mounted, a sheet fixing section for fixing the sheet in such a manner as to partition the inside space of the pressure reduction chamber into a first space and a second space, a heating unit that heats the sheet to soften the sheet, and a control unit. The sheet fixing section has an outer periphery fixing section that fixes an outer periphery of the sheet, and a temporary fixing section that temporarily fixes a central portion of the sheet to the substrate mounted on a support table through a gap between the sheet and the substrate.

12 Claims, 6 Drawing Sheets

PROTECTIVE MEMBER ATTACHING APPARATUS AND PROTECTIVE MEMBER ATTACHING METHOD

BACKGROUND OF THE INVENTION

Field of the Invention

The present invention relates to a protective member attaching apparatus and a protective member attaching method.

Description of the Related Art

Semiconductor devices and various device chips for use in various electronic apparatuses are manufactured by grinding, with a grindstone, a substrate formed with the devices, to thin the substrate, and dividing the substrate along streets set on the wafer. At the time of grinding and dividing, the processing is performed generally in a state in which a protective tape is attached to the front surface of the substrate to protect the devices and prevent the chips from being scattered.

While the protective tape is attached to the substrate by a glue layer formed on the surface to be attached, a residue of the glue is left on the front surface of the substrate upon peeling off of the protective tape, whereby an adverse influence may be exerted on the devices. Particularly, in the case of a semiconductor wafer on which bumps serving as electrodes are mounted, a protective tape with a thick glue layer for absorbing projections and recesses arising from the bumps is used, and therefore, the residue of the glue is liable to be generated.

In view of this, a processing method in which a sheet free of glue layer is compression-bonded to the substrate while the sheet is softened by heat, to thereby attach the sheet to the substrate, has been devised (see, for example, Japanese Patent Laid-open No. 2019-201016).

SUMMARY OF THE INVENTION

By the method described in Japanese Patent Laid-open No. 2019-201016, the problem of the residue of the glue is dissolved; however, for securely fixing a sheet free of glue layer to the substrate, it is important to bring the sheet into close contact with the substrate without air being caught between the semiconductor wafer as a substrate and the sheet.

In view of this, a method of attaching the sheet to the substrate by use of a pressure reduction chamber has been devised. However, when even a slight differential pressure is generated, the sheet fixed only at an outer periphery thereof is attached to the substrate while swinging in a sagging manner, resulting in a problem that the sheet would be wrinkled. Other than this, there is another problem that, since the temperature inside the chamber is high, the sheet is contracted and is liable to be wrinkled.

Accordingly, it is an object of the present invention to provide a protective member attaching apparatus and a protective member attaching method by which a sheet free of glue layer can be attached to a substrate while wrinkling of the sheet is restrained.

In accordance with an aspect of the present invention, there is provided a protective member attaching apparatus for attaching a thermoplastic resin sheet to a front surface of a substrate having projections and recesses on the front surface side, the protective member attaching apparatus including a pressure reduction chamber that includes an upper housing and a lower housing separable from the upper housing, with a pressure reduction unit and an atmospheric air opening unit connected respectively to the upper housing and the lower housing, a support table that is provided inside the lower housing and on which the substrate is mounted, a sheet fixing section for fixing a sheet in such a manner as to partition an inside space of the pressure reduction chamber into the upper housing side and the lower housing side when the upper housing and the lower housing are united, a heating unit that heats the sheet to soften the sheet, and a control unit that controls the pressure reduction chamber and the heating unit to reduce pressures inside the upper housing and the lower housing, and thereafter softens and brings the sheet into close contact with the substrate mounted on the support table by a differential pressure generated by opening the upper housing to the atmospheric air. In the protective member attaching apparatus, the sheet fixing section has an outer periphery fixing section that fixes an outer periphery of the sheet, and a temporary fixing section that holds that region of the sheet that faces the support table from the upper housing side and temporarily fixes the sheet to the substrate mounted on the support table, through a gap between the sheet and the substrate, the temporary fixing section is a support plate provided on a lower surface thereof with a resin layer for holding the sheet by a tack force, and the resin layer and the support plate are formed with ventilation holes.

Preferably, the heating unit heats the support table.

In accordance with another aspect of the present invention, there is provided a protective member attaching method for attaching a thermoplastic resin sheet to a front surface of a substrate having projections and recesses on the front surface side by use of a protective member attaching apparatus including a pressure reduction chamber that includes an upper housing and a lower housing separable from the upper housing, with a pressure reduction unit and an atmospheric air opening unit connected respectively to the upper housing and the lower housing, a support table that is provided inside the lower housing and on which the substrate is mounted, a sheet fixing section that fixes the sheet in such a manner as to partition an inside space of the pressure reduction chamber into the upper housing side and the lower housing side when the upper housing and the lower housing are united, a heating unit that heats the sheet to soften the sheet, and a control unit that controls the pressure reduction chamber and the heating unit to reduce pressures inside the upper housing and the lower housing, and thereafter softens and brings the sheet into close contact with the substrate mounted on the support table by a differential pressure generated by opening the upper housing to the atmospheric air, the sheet fixing section having an outer periphery fixing section that fixes an outer periphery of the sheet, and a temporary fixing section that holds that region of the sheet that faces the support table from the upper housing side and temporarily fixes the sheet to the substrate mounted on the support table, through a gap between the sheet and the substrate, the temporary fixing section being a support plate provided on a lower surface thereof with a resin layer for holding the sheet by a tack force, the resin layer and the support plate being formed with ventilation holes, the protective member attaching method including a heating step of operating the heating unit; a preparation step of fixing the sheet to the sheet fixing section and mounting the substrate on the support table; a pressure reduction step of uniting the upper housing and the lower housing and reducing pressures inside the upper housing and the lower housing in a state in which the sheet held by the temporary fixing section on an upper side of the substrate faces the substrate, after the heating step and the preparation step are carried out, and a sheet close contact step of causing the pressure inside the upper housing to approach the atmospheric pressure to set a difference in atmospheric pressure between the inside of the upper housing and the inside of the lower housing to be equal to or more than a predetermined value, thereby causing the sheet to be separated from the temporary fixing section and brought into close contact with the substrate, after the pressure reduction step is carried out.

Preferably, the sheet close contact step includes a preliminary close contact step of causing the inside of the upper housing to approach the atmospheric pressure and bringing a center of the sheet into close contact with the substrate, and a final close contact step of bringing the inside of the upper housing to the atmospheric pressure to widen a close contact area of the sheet brought into close contact with the substrate in the preliminary close contact step from the center to the outside of the sheet.

According to the present invention, such an effect is produced that it is possible to attach a sheet free of glue layer to a substrate while wrinkling of the sheet is restrained.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

An embodiment of the present invention will be described in detail below referring to the drawings. The present invention is not to be limited by the contents of the following description of the embodiment. In addition, the constituent elements described below include those which can easily be conceived of by a person skilled in the art and those which are substantially the same. Further, the configurations described below can be combined as required. Besides, various omissions, replacements, or modifications of the configuration can be performed in such ranges as not to depart from the gist of the present invention.

Figure 1:
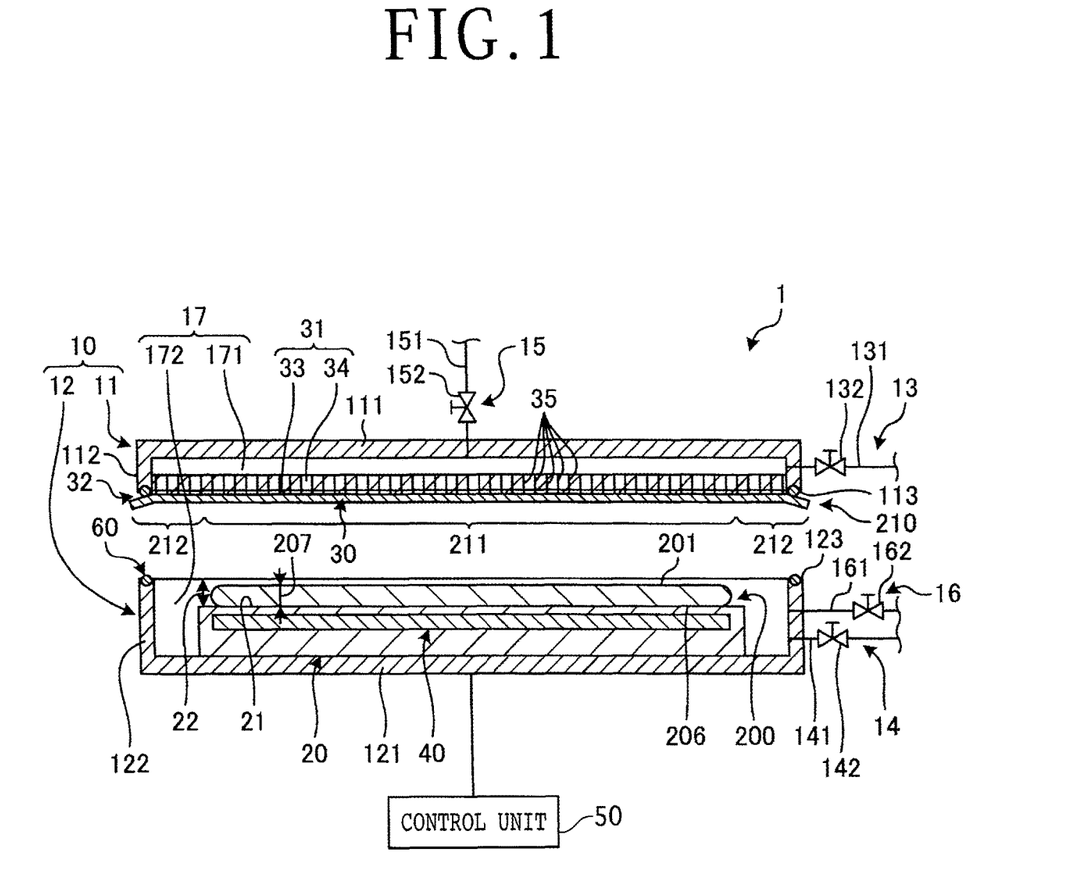
FIG. 1 is a sectional view of a configuration example of a protective member attaching apparatus according to an embodiment of the present invention.
Figure 2:
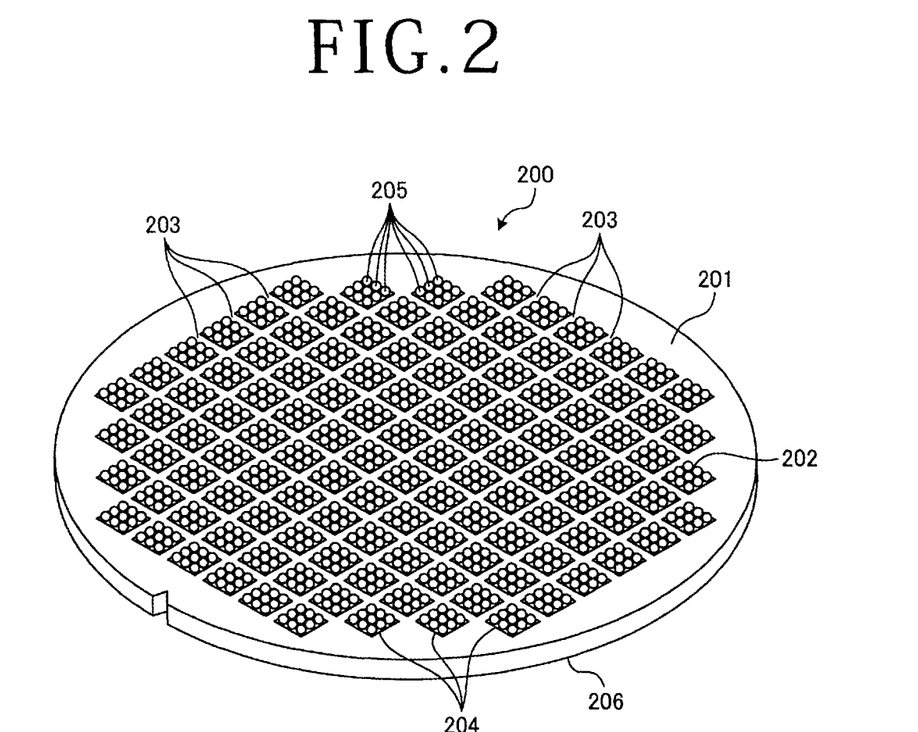
FIG. 2 is a perspective view depicting an example of a substrate to which a sheet is attached by the protective member attaching apparatus depicted in FIG. 1.
Figure 3:
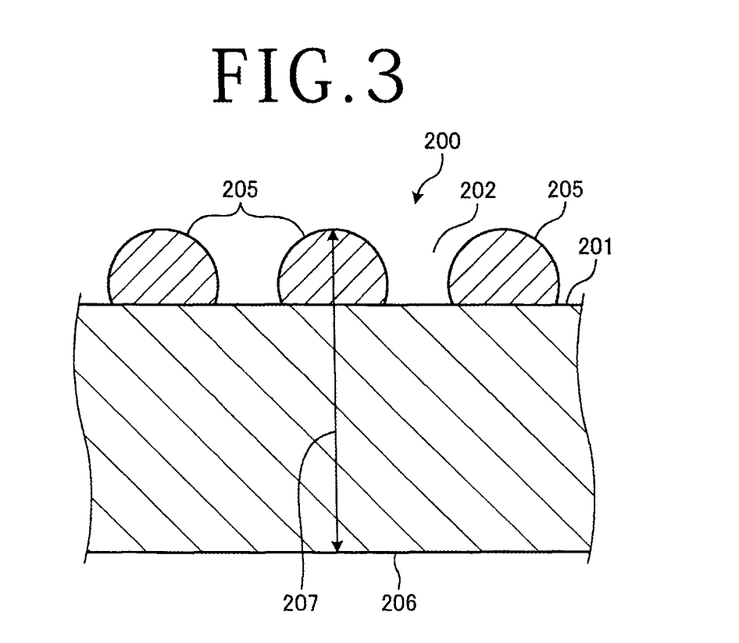
FIG. 3 is a sectional view of a major part of the substrate depicted in FIG. 2.

A protective member attaching apparatus according to an embodiment of the present invention will be described in reference to the drawings. FIG. 1 is a sectional view of a configuration example of the protective member attaching apparatus according to the embodiment. FIG. 2 is a perspective view depicting an example of a substrate to which a sheet is attached by the protective member attaching apparatus depicted in FIG. 1. FIG. 3 is a sectional view of a major part of the substrate depicted in FIG. 2.

A protective member attaching apparatus 1 depicted in FIG. 1 according to the embodiment is an apparatus for attaching a thermoplastic sheet 210 to a front surface 201 of a substrate 200 provided on the front surface 201 side with projections and recesses 202 (depicted in FIG. 2). In the embodiment, the substrate 200 is such a wafer as a circular semiconductor wafer or an optical device wafer with silicon (Si), sapphire ($Al_2O_3$), gallium arsenide (GaAs), silicon carbide (SiC), or the like as a base material. Note that FIG. 1 omits the projections and recesses 202 on the front surface 201 side of the substrate 200.

As depicted in FIG. 2, the substrate 200 is formed with devices 204 in each region of the front surface 201 partitioned by a plurality of intersecting streets 203. As depicted in FIGS. 2 and 3, the devices 204 have bumps 205 that are connected to electrodes of the devices 204 and that project from the front surface 201. The devices 204 are, for example, an integrated circuit such as an integrated circuit (IC) or large scale integration (LSI), an image sensor such as a charge coupled device (CCD) or a complementary metal oxide semiconductor (CMOS), micro electro mechanical systems (MEMS), or the like. The bumps 205 include a conductive metal, and, in the embodiment, are formed in a spherical shape.

The bumps 205 are for establishing electrical connection between the electrodes of the devices 204 and the substrate or the like to which the devices 204 are mounted. In the embodiment, the substrate 200 has the bumps 205 projecting from the front surface 201, whereby the projections and recesses 202 are formed on the front surface 201. In addition, in the embodiment, the substrate 200 includes the projections and recesses 202 on the front surface 201 while having the bumps 205.

In the embodiment, the substrate 200 has a sheet 210 attached to the front surface 201 side, and, in a state in which the front surface 201 side is held on a chuck table of a grinding apparatus with the sheet 210 therebetween, a back surface 206 opposite to the front surface 201 is ground, whereby the substrate 200 is thinned to a predetermined finish thickness. After being thinned, the substrate 200 is divided along the streets 203 into the individual devices 204.

The sheet 210 is formed in a sheet shape from a thermoplastic resin, with a plan-view shape being larger in diameter than the substrate 200. In the embodiment, the sheet 210 has a front surface and a back surface both being formed flat. The sheet 210 includes a thermoplastic resin having a flexibility and a non-tacky property, and has a glue layer including a pressure sensitive adhesive resin. In addition, the thermoplastic resin constituting the sheet 210 is contractible and extendable, is softened when heated beyond a softening point, and is contracted when further heated. In the embodiment, the sheet 210 includes a resin which is transparent or semi-transparent to visible light. In the embodiment, the sheet 210 is a sheet of a polymer synthesized from an alkene as a monomer, and includes, for example, polyethylene, polypropylene, polystyrene or the like as a thermoplastic resin. In the embodiment, the thickness of the sheet 210 is equal to or more than 50 µm but equal to or less than 150 µm.

As depicted in FIG. 1, the protective member attaching apparatus 1 according to the embodiment includes a pressure reduction chamber 10, a support table 20, a sheet fixing section 30, a heating unit 40, and a control unit 50.

The pressure reduction chamber 10 is separable into an upper housing 11 and a lower housing 12, and pressure reduction units 13 and 14 and atmospheric air opening units 15 and 16 are connected respectively to the upper housing 11 and the lower housing 12.

The upper housing 11 and the lower housing 12 include flat plates 111 and 121 and peripheral plates 112 and 122 erected from outer edges of the flat plates 111 and 121. The upper housing 11 and the lower housing 12 are formed with the plan-view shapes of the flat plate 111 and 121 being the same shape. The upper housing 11 and the lower housing 12 are moved by an unillustrated moving unit over a position where edges 113 and 123 of the peripheral plates 112 and 122 which are on the side spaced from the flat plates 111 and 121 and a position where the edges 113 and 123 are spaced from each other. The upper housing 11 and the lower housing 12 are united when those edges 113 and 123 of the peripheral plates 112 and 122 which are on the side spaced from the flat plates 111 and 121 overlap with each other.

The pressure reduction units 13 and 14 include pipes 131 and 141 which have one end connected to an unillustrated suction source and the other end opening into the housings 11 and 12 and on-off valves 132 and 142 provided in the pipes 131 and 141. The pressure reduction units 13 and 14 reduce the pressures in the housings 11 and 12 by opening of the on-off valve 132 and 142 and suction by the suction source.

The atmospheric air opening units 15 and 16 include pipes 151 and 161 which have one end opened to the atmospheric air and the other end opening into the housings 11 and 12 and on-off valves 152 and 162 provided in the pipes 151 and 161. The atmospheric air opening units 15 and 16 open the inside of the housings 11 and 12 to the atmospheric air by opening of the on-off valves 152 and 162. In addition, the pipe 151 of the atmospheric air opening unit 15 of the upper housing 11 is open at the center of an inner surface of the flat plate 111.

The support table 20 is provided inside the lower housing 12, and the back surface 206 opposite to the front surface 201 of the substrate 200 is mounted thereon. The support table 20 is formed to be larger than the substrate 200, and is disposed on the flat plate 121 of the lower housing 12. An upper surface 21 of the support table 20 is formed flat along the edge 123 of the peripheral plate 122 of the lower housing 12, and the back surface 206 of the substrate 200 is mounted thereon.

In addition, the distance 22 from the edge 123 of the peripheral plate 122 to the upper surface 21 of the support table 20 is longer than the thickness 207 of the substrate 200, and is longer than the thickness 207 of the substrate 200 at a position where the bump 205 is provided. Therefore, the front surface 201 of the substrate 200 mounted on the upper surface 21 of the support table 20 and the bumps 205 are disposed nearer to the flat plate 121 than to the edge 123 of the peripheral plate 122 of the lower housing 12, that is, in the inside of the lower housing 12.

The sheet fixing section 30 is for fixing the sheet 210 such that the sheet 210 partitions the inside space 17 of the pressure reduction chamber 10 into a first space 171 which is the inside on the upper housing 11 side and a second space 172 which is the inside on the lower housing 12 side, when the upper housing 11 and the lower housing 12 are united. The sheet fixing section 30 has a temporary fixing section 31 and an outer periphery fixing section 32.

The temporary fixing section 31 is for holding a central portion 211 which is a region of the sheet 210 facing the support table 20 from the upper housing 11 side, and for temporarily fixing the sheet 210 to the substrate 200 mounted on the support table 20 through a gap between the sheet 210 and the substrate 200. Note that the central portion 211 of the sheet 210 is that region of the sheet 210 which faces the support table 20 of the sheet 210 along the direction orthogonal to the front surface 201 of the substrate 200. In addition, the temporary fixing refers to fixing to such an extent as to permit the sheet 210 to be separated.

In the embodiment, the temporary fixing section 31 is a support plate 34 provided on a lower surface with a resin layer 33 that holds the sheet 210 by a tack force. The support plate 34 is formed in a flat plate shape having an outer shape equal to that of the flat plate 111 of the upper housing 11, and is attached to the upper housing 11 in the manner of closing an opening surrounded by the edge 113 of the peripheral plate 112 of the upper housing 11. In the embodiment, the support plate 34 includes an aluminum alloy, and has a thickness of 15 mm.

The support plate 34 has a resin layer 33 of a constant thickness laminated on a lower surface thereof. The resin layer 33 produces a tack force (also called an adhesive force) to such an extent that the sheet 210 is not deviated positionally, and includes a resin that fixes (hereinafter described as temporarily fixes) the sheet 210 by the tack force. In the embodiment, the resin layer 33 includes, for example, a urethane resin with an Asker C hardness of equal to or less than 30 degrees (what is generally called a urethane gel having a cushioning property, a pressure sensitive adhesive force, earthquake-proof, vibration-proof, and soundproof properties, and shock resistance), and has a thickness of 1 mm. In addition, the resin layer 33 and the support plate 34 are formed with ventilation holes 35 penetrating them. A plurality of the ventilation holes 35 are provided at intervals in the resin layer 33 and the support plate 34, and, in the embodiment, are provided evenly over the whole parts of the resin layer 33 and the support plate 34.

The support plate 34 fixes the central portion 211 which is that region of the sheet 210 which faces the support table 20 to the resin layer 33, by the tack force of the resin layer 33, and holds it on the upper housing 11 side. In addition, the support plate 34 has the lower surface of the resin layer 33 to which the sheet 210 is to be fixed be disposed on the same plane as the edge 113 of the peripheral plate 112 of the upper housing 11. Therefore, when the housings 11 and 12 are positioned at positions where the edges 113 and 123 of the peripheral plates 112 and 122 overlap with each other, the support plate 34 temporarily fixes the sheet 210 to the substrate 200 mounted on the support table 20 through a gap between the sheet 210 and the substrate 200, since the abovementioned distance 22 is longer than the thickness 207.

The outer periphery fixing section 32 is for fixing rather an outer periphery 212 than the central portion 211 of the sheet 210. In the embodiment, the outer periphery fixing section 32 is attached to the whole circumference of the edge 113 of the peripheral plate 112 of the upper housing 11. In the embodiment, the outer periphery fixing section 32 includes an elastic material capable of elastic deformation such as rubber, and makes contact with the outer periphery 212 of the sheet 210 temporarily fixed to the temporary fixing section 31, thereby fixing the outer periphery 212 of the sheet 210.

In addition, when the housings 11 and 12 are positioned at such positions that the edges 113 and 123 of the peripheral plates 112 and 122 overlap with each other, the outer periphery fixing section 32 is elastically deformed in the direction for thinning, to seal the portion between the edge 113 of the peripheral plate 112 of the upper housing 11 and the outer periphery 212 of the sheet 210, thereby restricting gas from passing between the upper housing 11 and the sheet 210.

The heating unit 40 is for heating the sheet 210 to soften the sheet 210. In the embodiment, the heating unit 40 is a heater disposed inside the support table 20, and, by heating the support table 20, heats the sheet 210 through the support table 20 and the substrate 200. In the embodiment, the heating unit 40 heats the sheet 210 beyond the softening point of the thermoplastic resin constituting the sheet 210, to thereby soften the sheet 210.

The control unit 50 is for controlling the abovementioned constituent elements of the protective member attaching apparatus 1, namely, the pressure reduction chamber 10 and the heating unit 40, to reduce the pressures inside the upper housing 11 and the lower housing 12, and softening and bringing the sheet 210 into close contact with the substrate 200 mounted on the support table 20 by a differential pressure in the housings 11 and 12 generated by opening the upper housing 11 to the atmospheric air. In other words, the control unit 50 causes the protective member attaching apparatus 1 to perform an operation of attaching the sheet 210 to the substrate 200.

Note that the control unit 50 is a computer having an arithmetic processing device having a microprocessor such as a central processing unit (CPU), a storage device having such a memory as a read only memory (ROM) or a random access memory (RAM), and an input-output interface device. The arithmetic processing device of the control unit 50 performs arithmetic processing according to a computer program stored in the storage device, and outputs control signals for controlling the protective member attaching apparatus 1 to the abovementioned constituent elements of the protective member attaching apparatus 1 through the input-output interface device.

The control unit 50 is connected to an unillustrated display unit including a liquid crystal display device or the like for displaying a state of a processing operation, images, and the like and an unillustrated input unit used when an operator registers processing contents information and the like. The input unit includes at least one of a touch panel provided on the display unit and an external input device such as a keyboard.

In addition, in the embodiment, the protective member attaching apparatus 1 has a seal member 60 including an elastic material capable of elastic deformation such as rubber, as depicted in FIG. 1, attached to the whole circumference of the edge 123 of the peripheral plate 122 of the lower housing 12. When the housings 11 and 12 are positioned at such positions that the edges 113 and 123 of the peripheral plates 112 and 122 overlap with each other, the seal member 60 is elastically deformed in the direction for thinning, to seal the portion between the edge 123 of the peripheral plate 122 of the lower housing 12 and the outer periphery 212 of the sheet 210, thereby restricting gas from passing between the lower housing 12 and the sheet 210.

Figure 4:
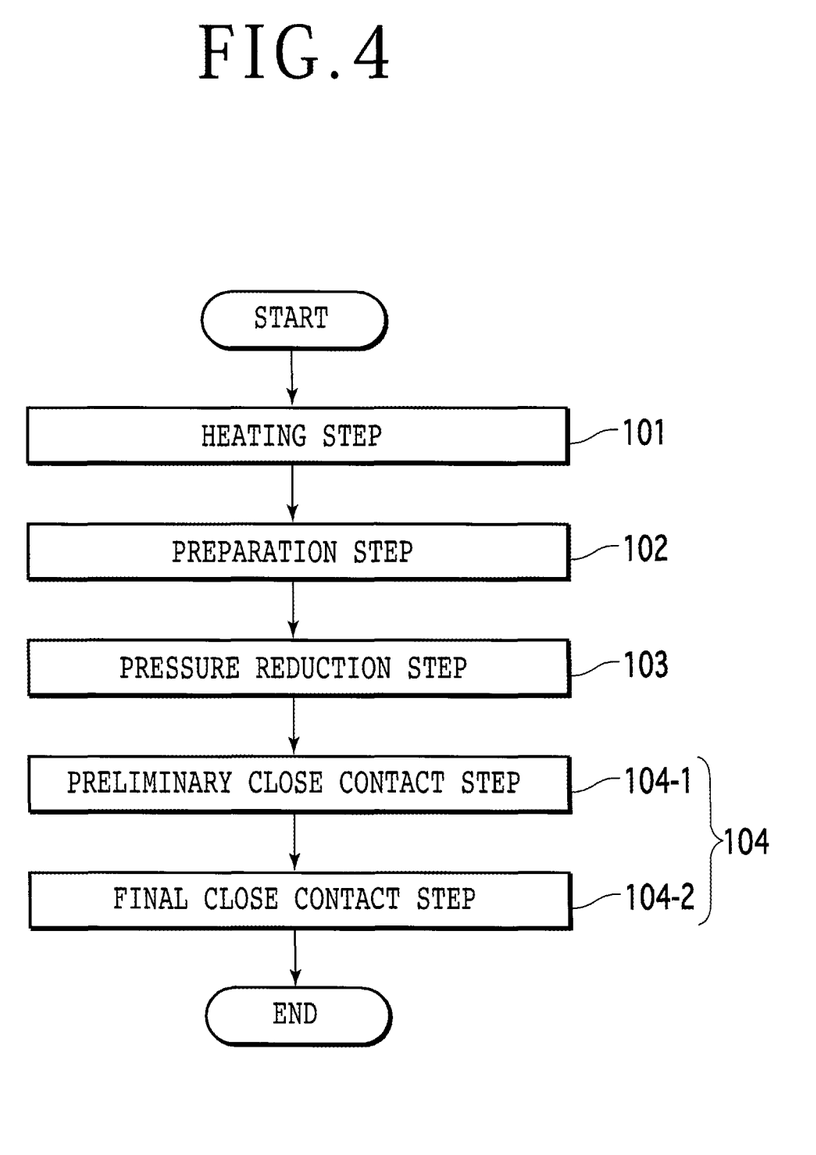
FIG. 4 is a flow chart depicting the flow of a protective member attaching method according to an embodiment.

Next, a protective member attaching method according to an embodiment of the present invention will be described in reference to the drawings. FIG. 4 is a flow chart depicting the flow of the protective member attaching method according to the embodiment. The protective member attaching method according to the embodiment is a method of attaching the thermoplastic resin sheet 210 to the front surface 201 of the substrate 200 provided on the front surface 201 side with the projections and recesses 202, by use of the abovementioned protective member attaching apparatus 1. In other words, the protective member attaching method according to the embodiment is also an attaching operation of the abovementioned protective member attaching apparatus 1. The protective member attaching method according to the embodiment includes a heating step 101, a preparation step 102, a pressure reduction step 103, and a sheet close contact step 104, as depicted in FIG. 4.

(Heating Step)

The heating step 101 is a step of operating the heating unit 40. In the heating step 101 of the embodiment, when the control unit 50 accepts processing conditions of an attaching operation through the input unit and stores the processing conditions in the storage device, and further accepts a starting instruction of the attaching operation from the operator, the protective member attaching apparatus 1 starts the attaching operation, and operates the heating unit 40, to heat the heating unit 40 to a temperature (for example, 100° C.) determined in advance in the processing conditions.

(Preparation Step)

Figure 5:
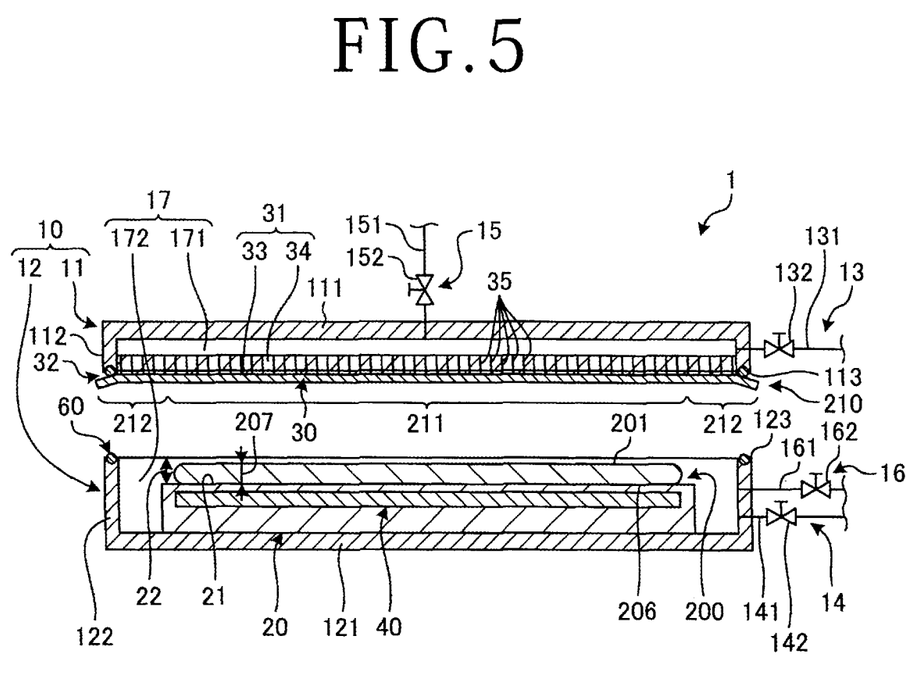
FIG. 5 is a sectional view depicting a preparation step of the protective member attaching method depicted in FIG. 4.

FIG. 5 is a sectional view depicting the preparation step of the protective member attaching method depicted in FIG. 4. The preparation step 102 is a step of fixing the sheet 210 to the sheet fixing section 30 and mounting the substrate 200 on the support table 20.

In the preparation step 102, the protective member attaching apparatus 1 positions the housings 11 and 12 of the pressure reduction chamber 10 at such positions that the edges 113 and 123 are spaced from each other and closes the on-off valves 142 and 162, so that the back surface 206 side of the substrate 200 is mounted on the support table 20 provided inside the lower housing 12 by unillustrated conveying means and the like. In addition, in the preparation step 102, the protective member attaching apparatus 1 closes the on-off valves 132 and 152, and feeds in the sheet 210 by sheet conveying means or the like such that the central portion 211 makes contact with the resin layer 33 of the sheet fixing section 30 and the outer periphery 212 makes contact with the outer periphery fixing section 32.

In the preparation step 102, the protective member attaching apparatus 1 temporarily fixes the central portion 211 of the sheet 210 to the resin layer 33 by the tack force, and fixes the outer periphery 212 of the sheet 210 to the outer periphery fixing section 32, as depicted in FIG. 5.

(Pressure Reduction Step)

Figure 6:
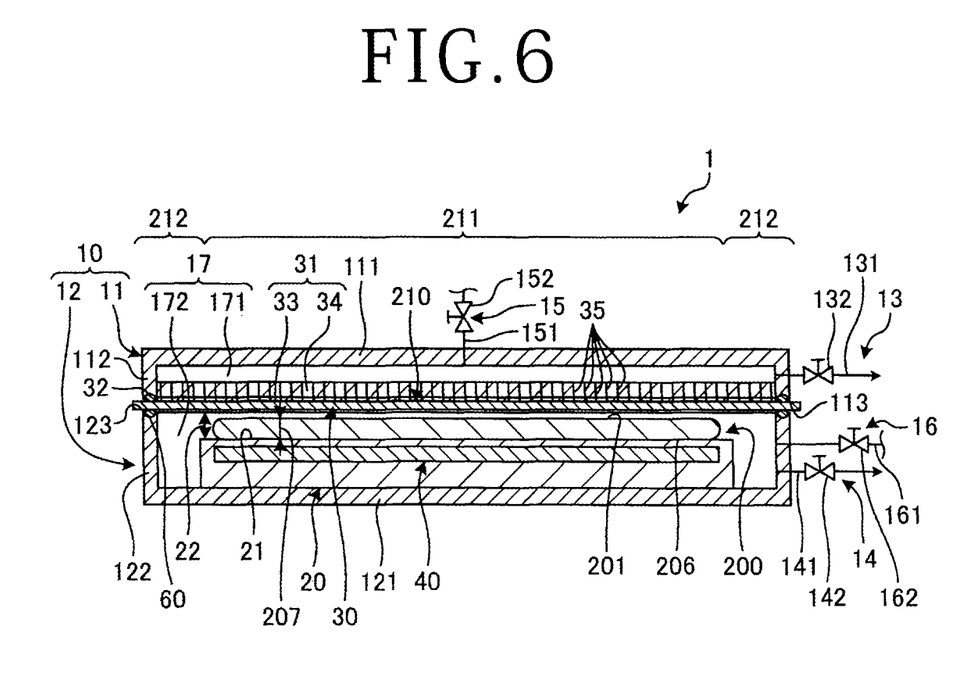
FIG. 6 is a sectional view depicting a pressure reduction step of the protective member attaching method depicted in FIG. 4.

FIG. 6 is a sectional view depicting the pressure reduction step of the protective member attaching method depicted in FIG. 4. The pressure reduction step 103 is a step of uniting the upper housing 11 and the lower housing 12 and reducing the pressures inside the upper housing 11 and the lower housing 12, in a state in which the sheet 210 held by the temporary fixing section 31 on an upper side of the substrate 200 faces the substrate 200, after the heating step 101 and the preparation step 102 are carried out.

In the pressure reduction step 103, as depicted in FIG. 6, the protective member attaching apparatus 1 positions the housings 11 and 12 at such positions that the edges 113 and 123 of the peripheral plates 112 and 122 overlap with each other, and unites the housings 11 and 12. Then, the protective member attaching apparatus 1 hermetically closes the inside space 17 of the pressure reduction chamber 10 by sealing by the sheet 210, the outer periphery fixing section 32, and the seal member 60, and the inside space 17 of the pressure reduction chamber 10 is partitioned into the first space 171 and the second space 172.

In the pressure reduction step 103, the protective member attaching apparatus 1 opens the on-off valves 132 and 142, and reduces the pressures inside the housings 11 and 12, namely, inside the first space 171 and the second space 172, by the pressure reduction units 13 and 14. In this instance, the sheet 210 makes close contact with the resin layer 33, to provide a gap between itself and the substrate on the support table 20. Note that, in the pressure reduction step 103 of the embodiment, the protective member attaching apparatus 1 opens the on-off valves 132 and 142 for a predetermined period of time, to reduce the pressures in the first space 171 and the second space 172 by the pressure reduction units 13 and 14, and, after pressure reduction is achieved in the spaces 171 and 172, closes the on-off valves 132 and 142.

(Sheet Close Contact Step)

Figure 7:
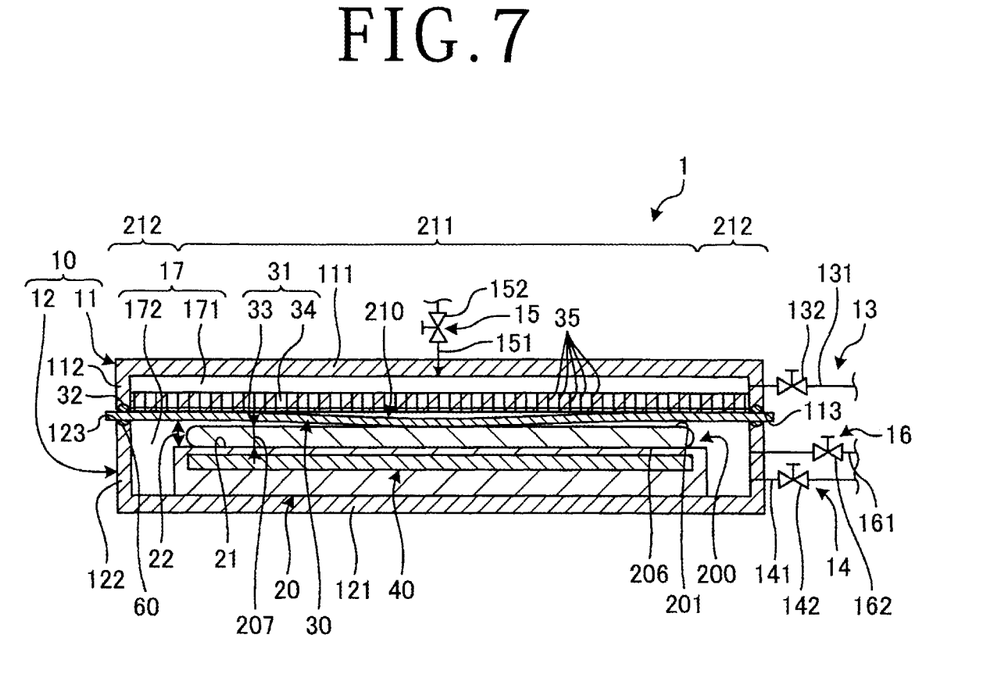
FIG. 7 is a sectional view depicting a preliminary close contact step in a close contact step of the protective member attaching method depicted in FIG. 4.
Figure 8:
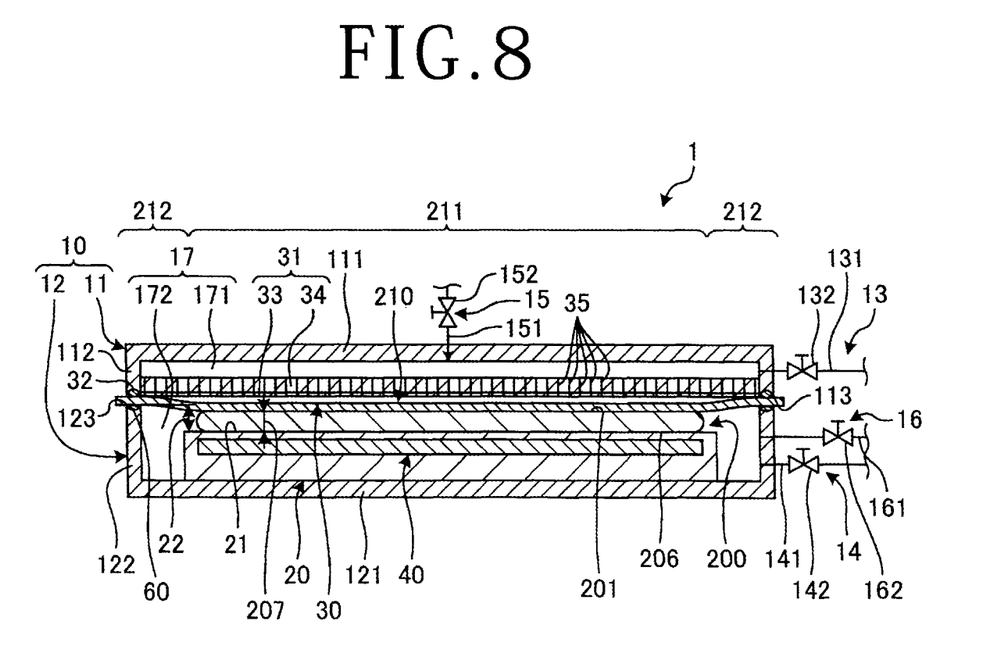
FIG. 8 is a sectional view depicting a final close contact step in the close contact step of the protective member attaching method depicted in FIG. 4.
Figure 9:
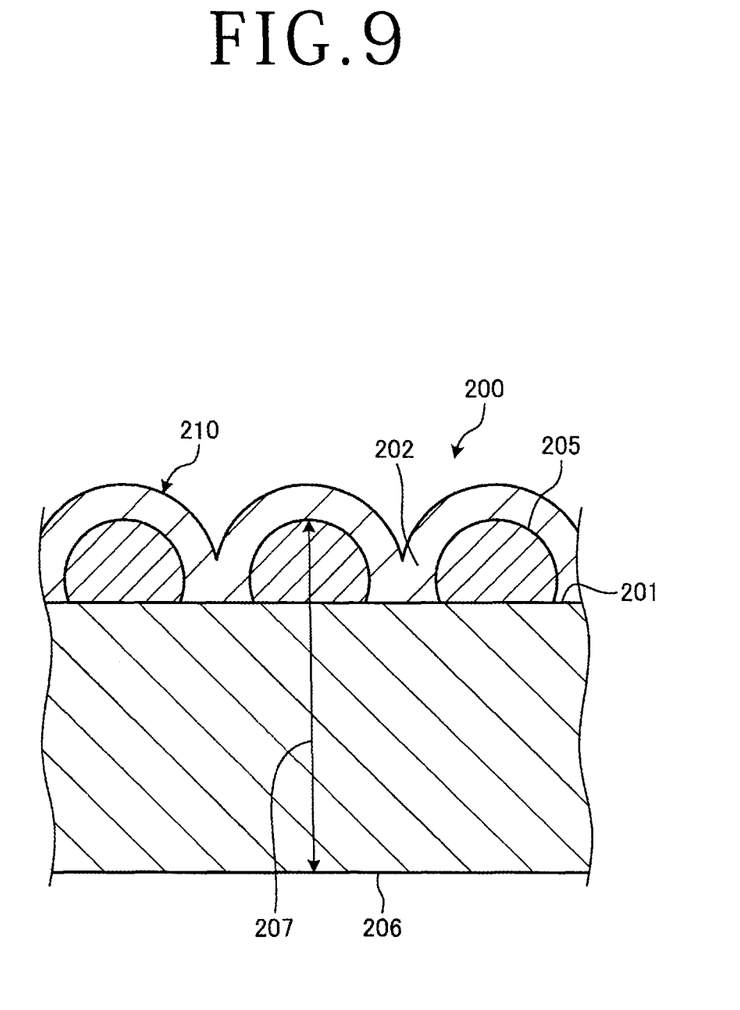
FIG. 9 is a sectional view of a major part of the substrate obtained after the close contact step of the protective member attaching method depicted in FIG. 4.

FIG. 7 is a sectional view depicting a preparatory close contact step in the close contact step of the protective member attaching method depicted in FIG. 4. FIG. 8 is a sectional view depicting a final close contact step in the close contact step of the protective member attaching method depicted in FIG. 4. FIG. 9 is a sectional view of a major part of the substrate obtained after the close contact step of the protective member attaching method depicted in FIG. 4.

The sheet close contact step 104 is a step of causing the gas pressure in the first space 171 which is the inside of the upper housing 11 to approach the atmospheric pressure, to set the difference in atmospheric pressure between the second space 172 which is the inside of the lower housing 12 and the first space 171 of the upper housing 11 to be equal to or more than a predetermined value, thereby causing the sheet 210 to be separated from the temporary fixing section 31 and make close contact with the substrate 200, after the pressure reduction step 103 is carried out.

In the sheet close contact step 104, the protective member attaching apparatus 1 opens the on-off valve 152 in a state in which the on-off valves 132, 142, and 162 are closed. Then, gas enters the first space 171 through the pipe 151 of the atmospheric air opening unit 15, whereby the gas pressure in the first space 171 approaches the atmospheric pressure. In addition, since the pipe 151 is open at the center of the flat plate 111, the gas entering the first space 171 passes through the ventilation hole 35 at the center near the opening of the pipe 151, of the ventilation holes 35 penetrating the support plate 34 and the resin layer 33, and presses the center of the sheet 210 toward the front surface 201 of the substrate 200. When the difference in atmospheric pressure between the second space 172 and the first space 171 of the upper housing 11 becomes equal to or more than a predetermined value, the protective member attaching apparatus 1 has the center of the sheet 210 separated from the resin layer 33 of the temporary fixing section 31 against the tack force of the resin layer 33, and the center of the sheet 210 makes contact with the front surface 201 of the substrate 200, as depicted in FIG. 7.

Since the substrate 200 is being heated by the heating unit 40 inside the support table 20, when the sheet 210 makes contact with the front surface 201 of the substrate 200, the sheet 210 is heated through the substrate 200 to a temperature beyond the softening point thereof, and is closely adhered to (that is, makes close contact with) the front surface 201 of the substrate 200 and is closely adhered to (that is, makes close contact with) the surfaces of the bumps 205.

In the sheet close contact step 104, the protective member attaching apparatus 1 has the center of the central portion 211 of the sheet 210 brought into close contact with the front surface 201 of the substrate 200, and has the center brought into close contact with the surfaces of the bumps 205, as depicted in FIG. 7. Note that FIG. 7 depicts a preliminary close contact step 104-1 in which the first space 171 of the upper housing 11 is caused to approach the atmospheric pressure, the center of the sheet 210 is brought into close contact with the substrate 200, and a gap is provided between the outer periphery 212 side of the central portion 211 and the substrate 200.

In the sheet close contact step 104, the protective member attaching apparatus 1 has the central portion 211 of the sheet 210 brought into close contact with the front surface 201 of the substrate 200 sequentially from the center to the outer periphery 212, and brought into contact with the surfaces of the bumps 205, as gas enters the first space 171 through the pipe 151 of the atmospheric air opening unit 15. In the sheet close contact step 104, as depicted in FIG. 8, when the first space 171 reaches the atmospheric pressure, the protective member attaching apparatus 1 has the central portion 211 of the sheet 210 wholly brought into close contact with the front surface 201 of the substrate 200, and brought into close contact with the surfaces of the bumps 205.

Note that FIG. 8 depicts a final close contact step 104-2 in which the first space 171 of the upper housing 11 is caused to reach the atmospheric pressure and the close contact area of the sheet 210 brought into close contact with the substrate 200 in the preliminary close contact step 104-1 is widened from the center toward the outer periphery 212 side. Thus, as depicted in FIG. 4, the sheet close contact step 104 includes the preliminary close contact step 104-1 in which the first space 171 of the upper housing 11 is caused to approach the atmospheric pressure and the center of the sheet 210 is brought into close contact with the substrate 200; and the final close contact step 104-2 in which the first space 171 of the upper housing 11 is caused to reach the atmospheric pressure and the close contact area of the sheet 210 brought into close contact with the substrate 200 in the preliminary close contact step 104-1 is widened from the center toward the outer periphery 212 side.

In the sheet close contact step 104, when a predetermined period of time has passed from the opening of the on-off valve 152, the protective member attaching apparatus 1 causes the whole part of the central portion 211 of the sheet 210 to make close contact with the front surface 201 of the substrate 200 and the surfaces of the bumps 205, as depicted in FIG. 9. In the sheet close contact step 104, the protective member attaching apparatus 1 opens the on-off valve 162 to open the second space 172 of the lower housing 12 to the atmospheric pressure, positions the housings 11 and 12 to such positions that the edges 113 and 123 of the peripheral plates 112 and 122 are spaced from each other, and conveys out the substrate 200 with the sheet 210 in close contact therewith on the support table 20 by unillustrated conveying means, whereby the protective member attaching method, that is, the attaching operation of the protective member attaching apparatus 1, is ended.

As has been described above, the protective member attaching apparatus 1 and the protective member attaching method according to the embodiment ensure that, since the sheet 210 is temporarily fixed to the resin layer 33 by a tack force in a state in which the sheet 210 faces the substrate 200 with a gap therebetween, the sheet 210 is separated from the resin layer 33 and brought into close contact with the substrate 200 for the first time when the difference in atmospheric pressure between the first space 171 and the second space 172 has become equal to or more than a predetermined value. In addition, since the center which is the position spaced most from the outer periphery fixing section 32 of the sheet 210 is separated first from the temporary fixing section 31, the protective member attaching apparatus 1 and the protective member attaching method produce such an effect that it is possible to attach the sheet 210 to the substrate 200 gradually from the center of the substrate 200 to the outer periphery 212, by matching the center of the support table 20 with the center of the sheet 210 and it is possible to restrain the sheet 210 attached to the substrate 200 from being wrinkled.

As a result, the protective member attaching apparatus 1 and the protective member attaching method produce such an effect that it is possible to attach the sheet 210 free of glue layer to the substrate 200 while restraining wrinkling of the sheet 210.

In addition, according to the protective member attaching apparatus 1 and the protective member attaching method, after the housings 11 and 12 of the pressure reduction chamber 10 are positioned at such positions that the edges 113 and 123 are spaced from each other and the sheet 210 is temporarily fixed to the resin layer 33 by the tack force, the housings 11 and 12 of the pressure reduction chamber 10 are positioned at such positions that the edges 113 and 123 overlap with each other, and thereafter the sheet 210 is attached to the substrate 200. Therefore, the protective member attaching apparatus 1 and the protective member attaching method ensure that, even when the sheet 210 is heated in the closed pressure reduction chamber 10, the sheet 210 is temporarily fixed to the resin layer 33 until being attached to the substrate 200, so that the sheet 210 is not liable to be contracted or wrinkled.

Note that the present invention is not limited to the above-described embodiment. In other words, the present invention can be carried out with various modifications in such ranges as not to depart from the gist of the invention. In the present invention, the upper housing 11 may include a sheet holding section for holding the outer periphery 212 of the sheet 210 by clamps or the like, in addition to the outer periphery fixing section 32. In addition, in the present invention, the projections and recesses of the substrate 200 may include projections and recesses of patterns forming the devices 204, other than the bumps 205. Besides, in the present invention, the substrate 200 may be a resin package substrate, other than the wafer.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A protective member attaching apparatus for attaching a thermoplastic resin sheet to a front surface of a substrate having projections and recesses on the front surface side, the protective member attaching apparatus comprising:
   a pressure reduction chamber that includes an upper housing and a lower housing separable from the upper housing, with a pressure reduction unit and an atmospheric air opening unit connected respectively to the upper housing and the lower housing;
   a support table that is provided inside the lower housing and on which the substrate is mounted;
   a sheet fixing section for fixing a sheet in such a manner as to partition an inside space of the pressure reduction chamber into the upper housing side and the lower housing side when the upper housing and the lower housing are united;
   a heating unit that heats the sheet to soften the sheet; and
   a control unit that controls the pressure reduction chamber and the heating unit to reduce pressures inside the upper housing and the lower housing, and thereafter softens and brings the sheet into close contact with the substrate mounted on the support table by a differential pressure generated by opening the upper housing to the atmospheric air,
   wherein the sheet fixing section has:
      an outer periphery fixing section that fixes an outer periphery of the sheet, wherein the outer periphery fixing section is positioned between the upper housing and the sheet and is configured and arranged to restrict gas from passing between the upper housing and the sheet when the upper housing and the lower housing are united, and
      a temporary fixing section that holds that region of the sheet that faces the support table from the upper housing side and temporarily fixes the sheet to the substrate mounted on the support table through a gap between the sheet and the substrate, and
   the temporary fixing section is a support plate provided on a lower surface thereof with a resin layer for holding the sheet by a tack force, and the resin layer and the support plate are formed with ventilation holes.

2. The protective member attaching apparatus according to claim 1, wherein the heating unit heats the support table.

3. A protective member attaching method for attaching a thermoplastic resin sheet to a front surface of a substrate having projections and recesses on the front surface side by use of a protective member attaching apparatus,
   the protective member attaching apparatus including:
      a pressure reduction chamber that includes an upper housing and a lower housing separable from the upper housing, with a pressure reduction unit and an atmospheric air opening unit connected respectively to the upper housing and the lower housing,
      a support table that is provided inside the lower housing and on which the substrate is mounted,
      a sheet fixing section that fixes the sheet in such a manner as to partition an inside space of the pressure reduction chamber into the upper housing side and the lower housing side when the upper housing and the lower housing are united,
      a heating unit that heats the sheet to soften the sheet, and
      a control unit that controls the pressure reduction chamber and the heating unit to reduce pressures inside the upper housing and the lower housing, and thereafter softens and brings the sheet into close contact with the substrate mounted on the support table by a differential pressure generated by opening the upper housing to the atmospheric air,
   the sheet fixing section having:
      an outer periphery fixing section that fixes an outer periphery of the sheet, wherein the outer periphery fixing section is positioned between the upper housing and the sheet and is configured and arranged to restrict gas from passing between the upper housing and the sheet when the upper housing and the lower housing are united, and a temporary fixing section that holds that region of the sheet that faces the support table from the upper housing side and temporarily fixes the sheet to the substrate mounted on the support table through a gap between the sheet and the substrate, the temporary fixing section being a support plate provided on a lower surface thereof with a resin layer for holding the sheet by a tack force, the resin layer and the support plate being formed with ventilation holes, the protective member attaching method comprising:

a heating step of operating the heating unit;

a preparation step of fixing the sheet to the sheet fixing section and mounting the substrate on the support table;

a pressure reduction step of uniting the upper housing and the lower housing and reducing pressures inside the upper housing and the lower housing in a state in which the sheet held by the temporary fixing section on an upper side of the substrate faces the substrate, after the heating step and the preparation step are carried out; and a sheet close contact step of causing the pressure inside the upper housing to approach the atmospheric pressure to set a difference in atmospheric pressure between the inside of the upper housing and the inside of the lower housing to be equal to or more than a predetermined value, thereby causing the sheet to be separated from the temporary fixing section and brought into close contact with the substrate, after the pressure reduction step is carried out, wherein the sheet close contact step includes a preliminary close contact sub-step in which a center of the sheet in brought into close contact with the substrate followed by a final close contact sub-step in which a close contact area is widened radially outwardly from the center of the sheet to an outer periphery of the sheet.

4. The protective member attaching method according to claim 3, wherein:

the preliminary close contact sub-step includes causing the inside of the upper housing to approach the atmospheric pressure, and the final close contact sub-step includes bringing the inside of the upper housing to the atmospheric pressure.

5. The protective member attaching apparatus according to claim 1, wherein the outer periphery fixing section comprises an elastic member that is configured and arranged to be deformed to seal a portion between an edge of the upper housing and the outer periphery of the sheet when the upper housing and the lower housing are united.

6. The protective member attaching apparatus according to claim 1, further comprising a seal member attached to an upper circumferential edge of the lower housing, wherein the seal member is configured and arranged restrict gas from passing between the lower housing and the sheet when the upper housing and the lower housing are united.

7. The protective member attaching method according to claim 3, wherein the outer periphery fixing section comprises an elastic member that is configured and arranged to be deformed to seal a portion between an edge of the upper housing and the outer periphery of the sheet when the upper housing and the lower housing are united.

8. The protective member attaching method according to claim 3, further comprising a seal member attached to an upper circumferential edge of the lower housing, wherein the seal member is configured and arranged restrict gas from passing between the lower housing and the sheet when the upper housing and the lower housing are united.

9. A protective member attaching method for attaching a thermoplastic resin sheet to a front surface of a substrate having projections and recesses on the front surface side by use of a protective member attaching apparatus, the protective member attaching apparatus including:

a pressure reduction chamber that includes an upper housing and a lower housing separable from the upper housing, with a pressure reduction unit and an atmospheric air opening unit connected respectively to the upper housing and the lower housing, a support table that is provided inside the lower housing and on which the substrate is mounted, a sheet fixing section that fixes the sheet in such a manner as to partition an inside space of the pressure reduction chamber into the upper housing side and the lower housing side when the upper housing and the lower housing are united, wherein when the upper housing and the lower housing are united, gas is restricted from passing between the upper housing side and the lower housing side, a heating unit that heats the sheet to soften the sheet, and a control unit that controls the pressure reduction chamber and the heating unit to reduce pressures inside the upper housing and the lower housing, and thereafter softens and brings the sheet into close contact with the substrate mounted on the support table by a differential pressure generated by opening the upper housing to the atmospheric air, the sheet fixing section having:

an outer periphery fixing section that fixes an outer periphery of the sheet, and a temporary fixing section that holds that region of the sheet that faces the support table from the upper housing side and temporarily fixes the sheet to the substrate mounted on the support table through a gap between the sheet and the substrate, the temporary fixing section being a support plate provided on a lower surface thereof with a resin layer for holding the sheet by a tack force, the resin layer and the support plate being formed with ventilation holes, the protective member attaching method comprising:

a heating step of operating the heating unit;

a preparation step of fixing the sheet to the sheet fixing section and mounting the substrate on the support table;

a pressure reduction step of uniting the upper housing and the lower housing and reducing pressures inside the upper housing and the lower housing in a state in which the sheet held by the temporary fixing section on an upper side of the substrate faces the substrate, after the heating step and the preparation step are carried out; and a sheet close contact step of causing the pressure inside the upper housing to approach the atmospheric pressure to set a difference in atmospheric pressure between the inside of the upper housing and the inside of the lower housing to be equal to or more than a predetermined value, thereby causing the sheet to be separated from the temporary fixing section and brought into close contact with the substrate, after the pressure reduction step is carried out.

10. The protective member attaching method according to claim 9, wherein the sheet close contact step includes:

a preliminary close contact step of causing the inside of the upper housing to approach the atmospheric pressure and bringing a center of the sheet into close contact with the substrate, and a final close contact step of bringing the inside of the upper housing to the atmospheric pressure to widen a close contact area of the sheet brought into close contact with the substrate in the preliminary close contact step, from the center to the outside of the sheet.

11. The protective member attaching method according to claim 9, wherein the sheet close contact step includes:

a preliminary close contact sub-step in which a center of the sheet in brought into close contact with the substrate followed by a final close contact sub-step in which a close contact area is widened radially outwardly from the center of the sheet to an outer periphery of the sheet.

12. The protective member attaching method according to claim 11, wherein:

the preliminary close contact sub-step includes causing the inside of the upper housing to approach the atmospheric pressure, and the final close contact sub-step includes bringing the inside of the upper housing to the atmospheric pressure.

* * * * *

UNITED STATES PATENT AND TRADEMARK OFFICE
CERTIFICATE OF CORRECTION

| | |
|---|---|
| PATENT NO. | : 11,894,248 B2 |
| APPLICATION NO. | : 17/648830 |
| DATED | : February 6, 2024 |
| INVENTOR(S) | : Kakinuma |

It is certified that error appears in the above-identified patent and that said Letters Patent is hereby corrected as shown below:

In the Claims

In Column 15, Line 14, delete "fmal" and insert -- final -- therefor.

Signed and Sealed this
Thirtieth Day of April, 2024

Katherine Kelly Vidal
*Director of the United States Patent and Trademark Office*